(12) United States Patent
He et al.

(10) Patent No.: US 6,570,211 B1
(45) Date of Patent: May 27, 2003

(54) 2BIT/CELL ARCHITECTURE FOR FLOATING GATE FLASH MEMORY PRODUCT AND ASSOCIATED METHOD

(75) Inventors: Yue-song He, San Jose, CA (US); Richard Fastow, Cupertino, CA (US); Zheng Wei, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/180,673

(22) Filed: Jun. 26, 2002

(51) Int. Cl.[7] .............................................. H01L 29/76
(52) U.S. Cl. ...................... 257/314; 257/315; 438/257; 365/185.33
(58) Field of Search ............................... 257/314–324; 438/201, 211, 257, 260–264; 365/185.33, 185

(56) References Cited

U.S. PATENT DOCUMENTS

| | | | | |
|---|---|---|---|---|
| 4,639,893 A | * | 1/1987 | Eitan | 365/185.16 |
| 5,656,845 A | * | 8/1997 | Akbar | 257/347 |
| 5,789,776 A | * | 8/1998 | Lancaster et al. | 257/296 |
| 6,008,516 A | * | 12/1999 | Mehrad et al. | 257/315 |
| 6,028,787 A | * | 2/2000 | Sansbury et al. | 365/185.01 |
| 6,157,575 A | * | 12/2000 | Choi | 365/185.29 |
| 6,188,095 B1 | * | 2/2001 | Hieke | 257/296 |
| 6,201,732 B1 | * | 3/2001 | Caywood | 365/185.05 |
| 6,369,736 B2 | * | 4/2002 | Tran et al. | 341/144 |

* cited by examiner

Primary Examiner—Hoai Ho
Assistant Examiner—Long Tran
(74) Attorney, Agent, or Firm—Eschweiler & Associates, LLC

(57) ABSTRACT

The invention relates to a flash memory devices and a method associated therewith in which combined source/drain regions are shared by more than two memory cells. For example, source/drain regions can be shared by four adjacent memory cells. Such sharing can be accomplished by providing memory cells along main branches of word lines and additional memory cells along dead end branches extending off the main branches. Another aspect of the invention relates to a flash memory device wherein the memory cells are arrayed and a first portion of the memory cells are read with source and drain regions sharing a row of the array and a second portion of the memory cells are read with source and drain regions sharing a column of the array.

15 Claims, 5 Drawing Sheets

2BIT/CELL ARCHITECTURE FOR FLOATING GATE FLASH MEMORY PRODUCT AND ASSOCIATED METHOD

TECHNICAL FIELD OF THE INVENTION

The present invention relates generally to semiconductor devices and more particularly to flash memory devices.

BACKGROUND OF THE INVENTION

There has long been a demand for small, portable personal devices. These devices include cellular phones, personal computing equipment, and personal sound systems, which are sought in continuously smaller sizes and with continuously lower power requirements. At the same time that smaller and more portable devices are sought, computational power and on-chip memory requirements are increasing. In light of these requirements, there has been a long-felt need for computational devices that have substantial memory and logic functions integrated within individual semiconductor chips. Preferably, the memory is configured such that if power is interrupted, as when a battery fails, the contents of the memory are retained. Memory that retains its content without a continuous supply of power is called non-volatile memory. Non-volatile memory types include, for example, electrically erasable, programmable read only memory (EEPPROM) and flash EEPROM.

The term "flash" refers to the ability of the memory to be erased in blocks. As in other non-volatile memory devices, flash memory devices typically store electrical charges, representing data, in transistors having either a floating-gate or a charge-trapping dielectric. The stored charges affect the threshold voltage of the transistors. For example, in an n-channel floating-gate transistor an accumulation of electrons in the floating-gate electrode creates a high threshold voltage in the transistor. The presence or absence of the stored charge can be determined by whether current flows between a source region and a drain region of the transistor when appropriate voltages are applied to the control gate, source, and drain.

Various structures have been proposed for making flash memory devices more compact. One such structure is a virtual ground array. While a non-virtual ground array structure has dedicated source and drain regions for reading and writing operations, a virtual ground array structure reduces the spacing between cells by employing dual purpose bit lines that can serve as either sources or drains according to the voltages applied.

Myriad other approaches have been proposed for making flash memory devices more compact. These approaches include improved processing techniques to produce smaller cells, improved materials that lend themselves to smaller cell sizes, and improved architectures that use space more efficiently. Nonetheless, there remains a long felt need for more compact flash memory devices.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

One aspect of the invention relates to a virtual ground array flash memory device in which individual combined source/drain regions are shared by more than two memory cells. For example, source/drain regions can be shared by four adjacent memory cells. Such sharing is possible, for example, through another aspect of the invention, wherein word lines are provided with dead end branches that extend to provide a second data adjacent to a memory cell that lies along the main branch of the word line, thereby providing multiple data bits per unit cell, for example a 2 bit/cell memory architecture.

A further aspect of the invention relates to a flash memory device wherein the memory cells are arrayed and a first portion of the memory cells are read with source and drain regions sharing a row of the array and a second portion of the memory cells are read with source and drain regions sharing a column of the array.

A still further aspect of the invention relates to a flash memory device wherein there are approximately two memory cells for each unit cell in the device. Where a memory can be divided into repeating units, a unit cell is the smallest repeating unit into which the memory can be divided. A memory cell includes a memory cell stack having a channel region isolated from the channel regions of adjacent stacks by source regions, drain regions, and/or isolation regions. The invention in its various aspects can provide flash memory devices that are more compact than conventional flash memory devices.

Yet another aspect of the present invention relates to a method of forming a flash memory device. The method comprises depositing and patterning a first polysilicon layer to form main branches of word lines, followed by the formation of an interpoly dielectric and a control gate layer. The interpoly dielectric and control gate layers are then patterned to form dead end branches associated with word lines which provide for a multiple bit per unit cell flash memory architecture.

In still another aspect of the present invention, a first polysilicon layer is formed and patterned, and an interpoly dielectric and second polysilicon layer forming a control gate layer are formed thereover. A hard mask is then formed and patterned, and sidewall spacers are then formed on the hard mask edges. The hard mask with sidewall spacers is then employed to pattern the word lines having dead branches associated therewith, wherein the sidewall spacer thickness dictates a distance between a dead end branch of one word line and a neighboring word line, and thus facilitates a close spacing between neighboring word lines, thereby improving cell density in the core region of the device.

Other advantages and novel features of the invention will become apparent from the following detailed description of the invention and the accompanying drawings. The detailed description of the invention and drawings provide exemplary embodiments of the invention. These exemplary embodiments are indicative of but a few of the various ways in which the principles of the invention can be employed.

DETAILED DESCRIPTION OF THE INVENTION

Figure 1:
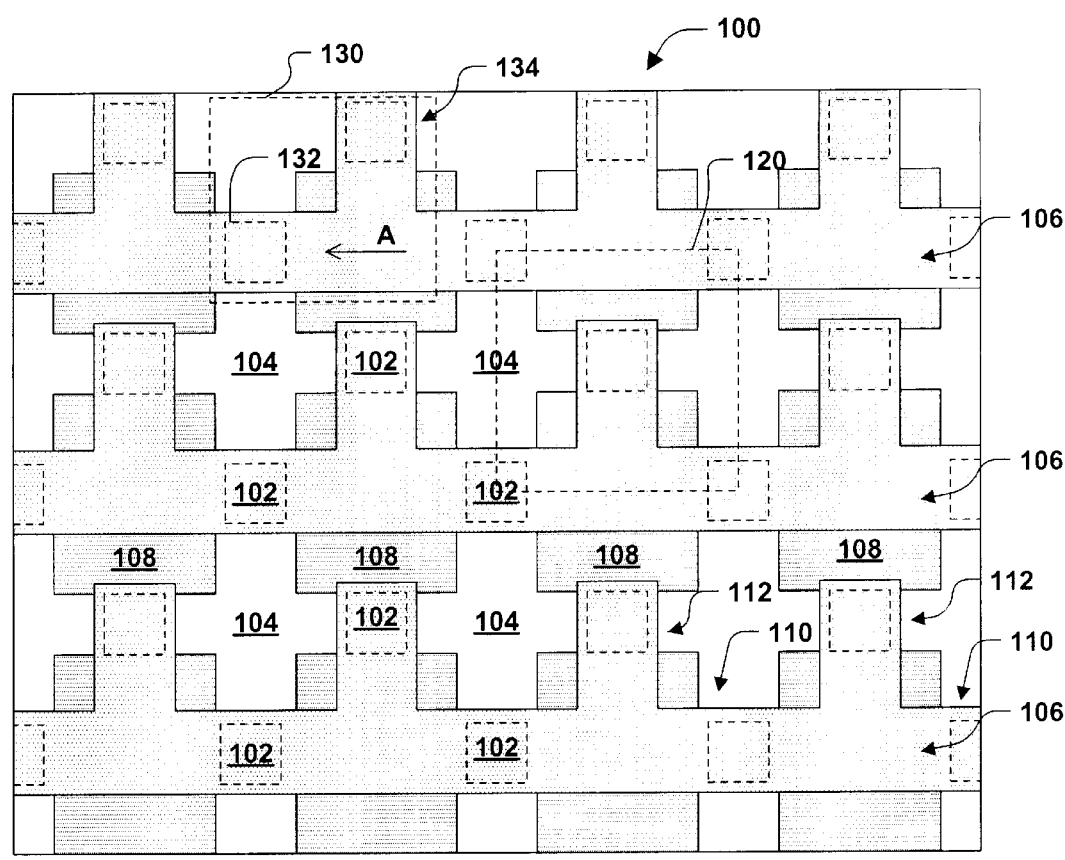
FIG. 1 is a schematic illustration showing a portion of a memory device according to one aspect of the present invention.

The present invention will now be described with reference to the drawings. FIG. 1 provides a schematic illustration of a portion of an exemplary virtual ground array flash memory device 100 according to one aspect of the present invention. The device 100 includes memory cell stacks 102, combined source/drain regions 104, word lines 106, and isolation regions 108. Word lines 106 have a principal direction indicated by the arrow A, main branches 110 extending along the principal direction A, and dead end branches 112 extending off the principal direction A. A first portion of the memory cell stacks 102 lie along the main branches 110 and a second portion of the memory cell stacks lie along the dead end branches 112.

The memory device 100 has approximately two memory cells or data bits per unit cell. The rectangular region 120 outlines one unit cell. As illustrated in FIG. 1, the exemplary unit cell 120 bisects four memory cells 102 and completely encompasses a fifth cell, thus there are at least two memory cells per unit cell. If each memory cell 102 is a conventional floating gate memory cell storing one bit of data, there will be at least two bits per unit cell in the memory device 100. For example, looking at region 130, in prior art architectures, the region 130 would comprise only one bit of data (associated with the region 132). However, in accordance with the present invention, the word line contains a dead end branch 134 which provides a second bit of data which can be accessed using source/drain regions adjacent thereto.

Figure 2:
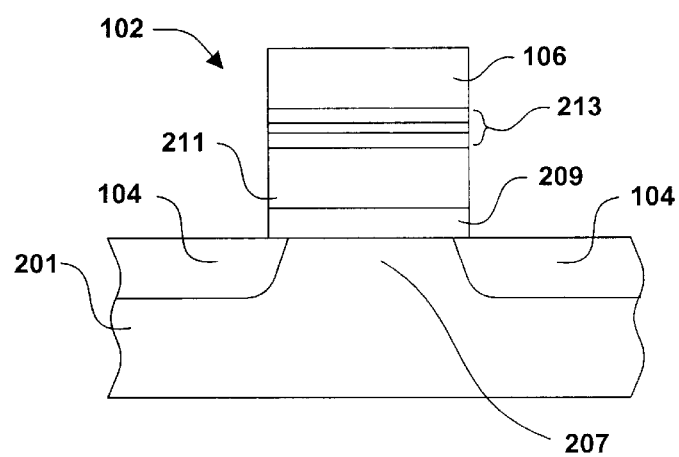
FIG. 2 is a schematic illustration of a floating gate memory cell stack.

FIG. 2 illustrates an exemplary floating gate memory cell 102 stack in cross section. The memory cell stack 102 overlays a first source/drain region 104, channel region 207, and a second source/drain region 104, which are formed in substrate 201. The memory cell stack 102 includes tunnel oxide 209, floating gate 211, inter-poly dielectric 213, and a control gate, which is part of a word line 106. Conventional ideas such as replacing the tunnel oxide 209 with a high-k dielectric can be employed without departing from the present invention.

While a floating gate memory cell stack has been illustrated and described, other memory cells types can be readily employed. For example, the memory cell stacks can be of SONOS type.

A one-bit per memory cell stack configuration has been illustrated and described, however, techniques for storing multiple bits in each memory cell stack can also be employed with the present invention. For example, multiple bits can be stored by trapping charges locally within the charge trapping layer or by distinguishing between multiple levels of trapped charge. Using such techniques, the number of bits stored in each unit cell can be increased to four or more.

According to another aspect of the invention, source/drain regions are shared by more than two adjacent memory cells. Referring to FIG. 1, the source/drain regions 104 are shared by memory cells lying above and below the source/drain regions 104 along the main branches 110, and to the left and the right of the source drain regions 104 along the dead end branches 112. Thus, in memory device 100, the majority of the source/drain regions 104 are shared by four adjacent memory cells.

In the present invention, each source/drain region is generally provided with a contact to facilitate addressing. Bit lines can be created by connecting source/drain regions, for example, in a metal layer overlying the structure illustrated in FIG. 1. For example, there can be two bit lines for each column of source/drain regions. One bit line can connect every other one of the source/drain regions 104 in a column. The second bit line can connect the remaining source/drain regions in the column. Each of the memory cells stacks 102 can then be addressed separately by selecting appropriate word and bit lines.

Figure 3:
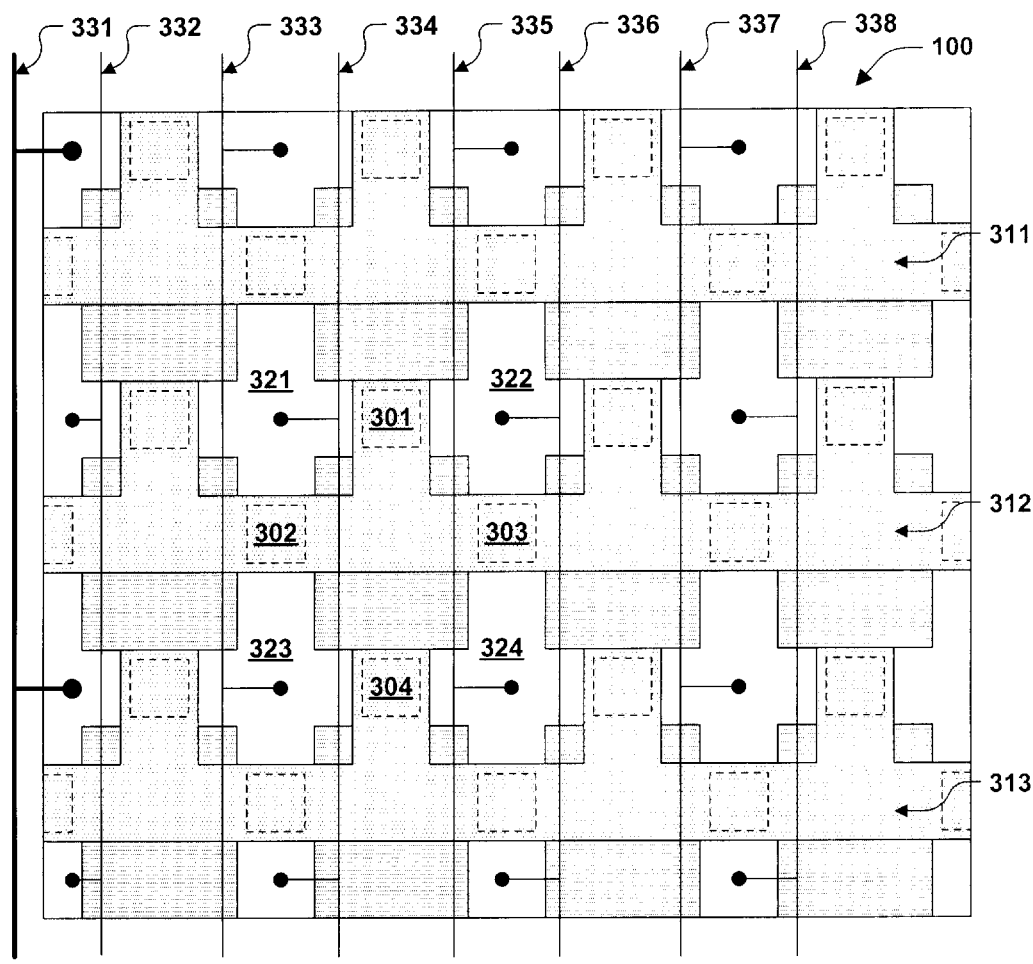
FIG. 3 a schematic illustration showing the memory device of FIG. 1 together with connections according to another aspect of the present invention.

FIG. 3 illustrates this type of connectivity. In FIG. 3, memory cells are labeled 301 to 304, word lines are labeled 311 to 313, source/drain regions are labeled 321 to 324, and bit lines are labeled 331 to 338. As can be seen in FIG. 3, the source/drain regions 321 and 323 are arranged in a column accessible using two of the electrically isolated bit lines 333 and 334, and the source/drain regions 322 and 324 are arranged in another column accessible using the two electrically isolated bit lines 335 and 336. Thus, the exemplary memory device of FIGS. 1 and 3 comprises memory cells (e.g., labeled cells 301–304 and others) and combined source/drain regions (e.g., a labeled source/drain regions 321–324 and others), where the source/drain regions are arranged in columns and there are two electrically isolated bit lines (e.g., bitlines 331–338 and others) per column. Table 1 identifies bit line and word line voltages for addressing each of the memory cells 301 to 304. For example, to address the memory cell 301 the bit lines 331 to 334 can be set to a source voltage, $S_V$, the bit lines 335 to 338 can be set to a drain voltage, $D_V$, the word line 312 can be set to a control gate voltage, $C_V$, and the remaining word lines can be turned off.

TABLE 1

Exemplary word and bit line voltages for addressing memory cells.

| | Bit Lines | | | | | | | | Word Lines | | |
|---|---|---|---|---|---|---|---|---|---|---|---|
| Cell | 331 | 332 | 333 | 334 | 335 | 336 | 337 | 338 | 311 | 312 | 313 |
| 301 | $S_v$ | $S_v$ | $S_v$ | $S_v$ | $D_v$ | $D_v$ | $D_v$ | $D_v$ | 0 | $C_v$ | 0 |
| 302 | $D_v$ | $D_v$ | $D_v$ | $S_v$ | $D_v$ | $D_v$ | $D_v$ | $D_v$ | 0 | $C_v$ | 0 |
| 303 | $D_v$ | $D_v$ | $D_v$ | $D_v$ | $S_v$ | $D_v$ | $D_v$ | $D_v$ | 0 | $C_v$ | 0 |
| 304 | $S_v$ | $S_v$ | $S_v$ | $S_v$ | $D_v$ | $D_v$ | $D_v$ | $D_v$ | 0 | 0 | $C_v$ |

Dead end branches extending off the word lines, as illustrated by the exemplary memory device 100 of FIG. 1, permit source/drain regions to have more than two adjacent memory cells. The dead end branches are generally rather short. In one embodiment, the dead end branches extend off the main branches by a length no more than about three memory cell widths which is equivalent to three word line widths. In another embodiment, their length is no more than about two word line widths. In a further embodiment, their length in no more than about one word line width.

Typically the width of the word lines are as small as a lithographic process used to form the word lines permits. In one embodiment, the word line width is no more than about 0.25 µm. In another embodiment, the word line width is no more than about 0.18 µm. In a further embodiment, the word line width is no more than about 0.13 µm. In another further embodiment, the word line width is no more than about 0.1 µm.

Memory devices with structures according to the present invention can have higher memory cell density than memory devices with conventional structures. In one embodiment, there are at least about 5 memory cells per µm². In another embodiment, there are at least about 10 memory cells per µm². In a further embodiment, there are at least about 20 memory cells per µm².

A memory device according to a further aspect of the invention is characterized by having two different memory cell orientations within an array. The orientation of the first set of memory cells is characterized in that the cells are read using a source and a drain sharing a column of the array, whereas the second set of memory cells is read using a source and drain sharing a row of the array. Locating memory cells between columns of source/drain regions and also between rows of source/drain regions in an array permits higher memory cell densities to be achieved. This further aspect of the invention is also exemplified by the memory device 100.

A still further aspect of the invention, also exemplified by the memory device 100, is a memory comprising two overlapping arrays of memory cells staggered with respect to one another. Preferably, the arrays are staggered in such a manner that a straight line between the two nearest neighbors of any given memory cell does not intersect the memory cell. For example, with reference to FIG. 3, the two nearest memory cells of the memory cell 301 will generally be the memory cells 302 and 303. A straight line between memory cells 302 and 303 does not intersect the memory cell 301. This is in contrast to a conventional memory device in which the nearest neighbors generally lie along a single unbranched word line.

Figure 4:
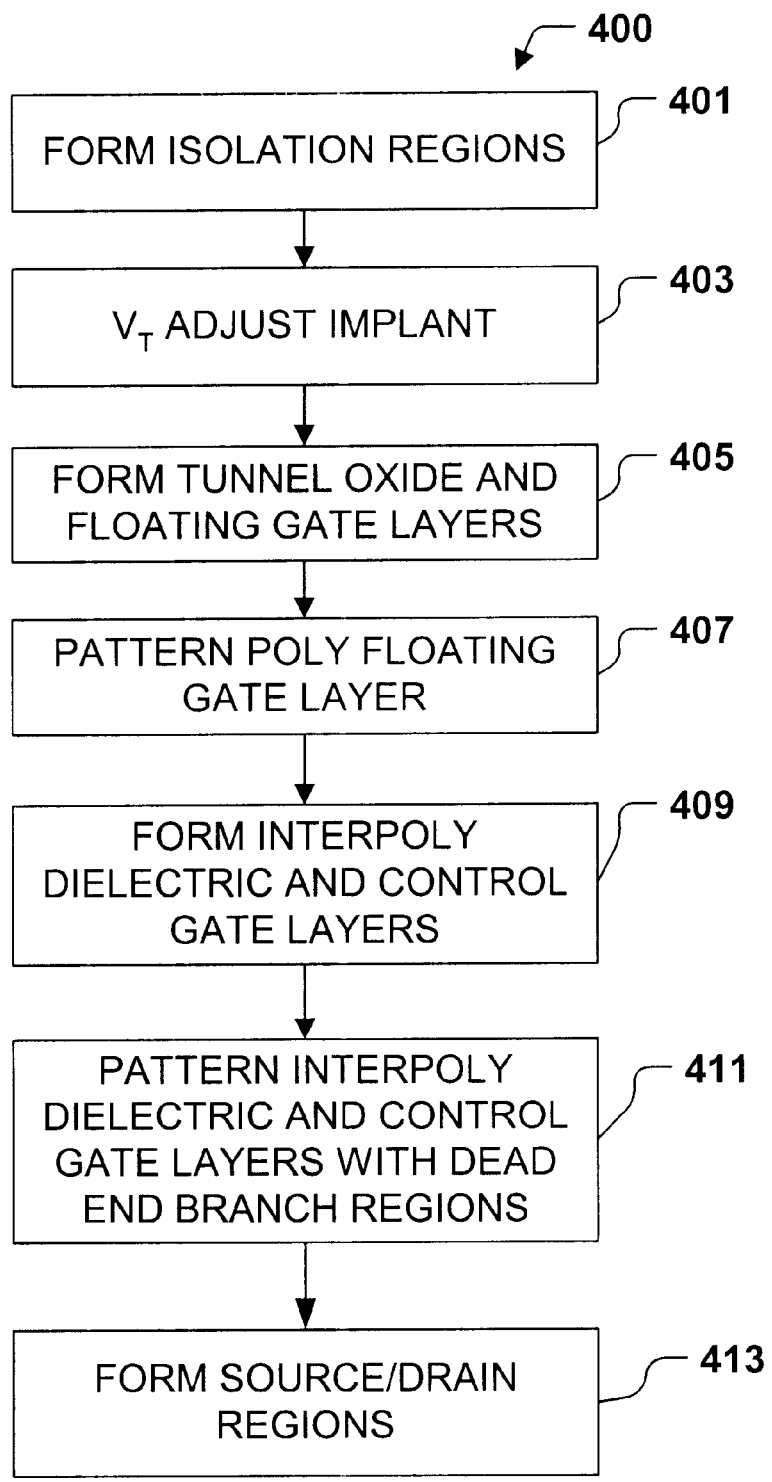
FIG. 4 is a flow chart of a process for forming devices according to the present invention.

Memory devices according to the present invention can be formed with conventional processing techniques. FIG. 4 provides a flow chart of an exemplary process 400. The process 400 includes act 401, forming isolation regions in a semiconductor substrate, act 403, providing a threshold voltage implant, act 405, forming a tunnel oxide and a polysilicon floating gate layer. The method 400 further includes act 407, patterning the polysilicon floating gate layer, act 409, forming an inter-poly dielectric layer and a polysilicon gate layer, act 411, patterning the inter-poly dielectric layer and the poly-silicon gate layer, and act 413, implanting source/drain regions with a self-aligned implantation process.

The semiconductor is typically silicon. Other examples of semiconductors include GaAs and InP. In addition to a semiconductor, the substrate may include various elements therein and/or layers thereon. These can include metal layers, barrier layers, dielectric layers, device structures, active elements and passive elements including silicon gates, word lines, source regions, drain regions, bit lines, bases emitters, collectors, conductive lines, conductive vias, etc.

Isolation regions are formed on or in the semiconductor substrate in act 401. Isolation regions comprise a dielectric, generally an oxide. Isolation region are generally formed by local oxidation of silicon (LOCOS) or shallow trench isolation (STI).

After forming the isolation regions in act 401, the substrate is doped in act 403 to set the threshold voltage ($V_T$) for the memory cells. The substrate can be doped lightly (n− or p−) or heavily (n+ or p+). Examples of suitable dopants include one or more of arsenic, boron, and phosphorus. The doping can involve several layers or wells. Generally, the uppermost well is made p-type.

After the threshold voltage setting implant, a tunnel oxide for the memory cells is formed in act 405. A tunnel oxide is typically formed by oxidizing a silicon semiconductor substrate. However, for very compact memory devices, it is often desirable to use a material that has a higher permittivity than silicon dioxide and can be provided in greater thickness than an equivalent silicon dioxide layer while giving the same capacitance. Such materials are referred to as high-k dielectrics. The term tunnel oxide is inclusive of high-k dielectrics, although not all high-k dielectrics are oxides.

High-k dielectrics include silicates, aluminates, titanates, and metal oxides Examples of silicate high-k dielectrics include silicates of Ta, Al, Ti, Zr, Y, La and Hf, including Zr and Hf doped silicon oxides and silicon oxynitrides. Examples of aluminates include transition metal aluminates, such as compounds of Zr and Hf. Examples of titanate high-k dielectrics include $BaTiO_3$, $SrTiO_3$, and $PdZrTiO_3$. Examples of metal oxide high-k dielectrics include oxides of refractory metals, such as Zr and Hf, and oxides of Lanthanide series metals, such as La, Lu, Eu, Pr, Nd, Gd, and Dy. Additional examples of metal oxide high-k dielectrics include $Al_2O_3$, $TiO_2$, $Ta_2O_5$, $Nb_2O_5$ and $Y_2O_3$.

Act 405 also includes forming the polysilicon floating gate layer. Polysilicon floating gates are generally formed by depositing amorphous silicon, which is subsequently annealed to form polysilicon. Although this annealing may not occur until later in the process, an amorphous silicon layer may be referred to as polysilicon.

In act 407, the polysilicon floating gates are lithographically patterned to define multiple cells along a given word line (and patterning the poly into separate word lines is typically performed later in conjunction with a stacked gate etch). Lithography refers to processes for pattern transfer between various media. In lithography, the substrate is coated uniformly with a radiation-sensitive film, the resist. The film is selectively exposed with radiation (such as visible light, ultraviolet light, x-rays, or an electron beam) through an intervening master template, the mask or reticle, forming a particular pattern. Exposed areas of the coating become either more or less soluble than the unexposed areas, depending on the type of coating, in a particular solvent developer. The more soluble areas are removed with the developer in a developing step. The less soluble areas remain on the substrate, forming a patterned resist. The pattern of the resist corresponds to the image, or negative image, of the reticle. The resist pattern can then be transferred to an underlying layer by etching using the resist as a mask.

After the floating gates are pattern, an inter-poly dielectric layer and a polysilicon gate layer are formed in act 409. The inter-poly dielectric is typically formed of three layers, a silicon oxide layer, a silicon nitride layer, and a silicon oxide (ONO). The polysilicon layer, from which the control gates and the word lines are formed thereover, may be doped to increase its conductivity.

Act 411 is another patterning step. Although the process and materials used in patterning are conventional, the mask pattern is generally characteristic of the present invention in that it can define word lines with dead end branches. Therefore whereas in prior art stacked gate etches (SGE), in which straight word lines were defined running generally parallel to one another, the SGE of the present invention defines generally parallel word lines that have a straight portion with dead end branches extending therefrom in a generally perpendicular manner, as illustrated in FIG. 1 at regions 102.

In the present invention, the SGE involves patterning the control poly layer, the ONO, and portions of the floating poly gate layer to reveal portions corresponding to regions 104 (in FIG. 1) of the semiconductor substrate. The source/drain implant may then be performed in one step or in multiple steps with individual source/drain implants, respectively.

While the forgoing process provides floating gate memory cells, SONOS memory cells can alternatively be employed. SONOS memory cell stacks include a charge trapping dielectric and a control gate. The charge trapping dielectric can be any dielectric layer or layers suitable for electron trapping. For example, charge trapping dielectrics include an ONO tri-layer dielectric, an oxide/nitride bi-layer dielectric, a nitride/oxide bi-layer dielectric, an oxide/tantalum oxide bi-layer dielectric ($SiO_2/Ta_2O_5$), an oxide/tantalum oxide/oxide tri-layer dielectric ($SiO_2/Ta_2O_5/SiO_2$), an oxide/strontium titanate bi-layer dielectric ($SiO_2/SrTiO_3$), an oxide/barium strontium titanate bi-layer dielectric ($SiO_2/BaSrTiO_2$), an oxide/strontium titanate/oxide tri-layer dielectric ($SiO_2/SrTiO_3/SiO_2$), an oxide/strontium titanate/barium strontium titanate tri-layer dielectric ($SiO_2/SrTiO_3/BaSrTiO_2$), and the like (in each case, the first layer mentioned is the bottom layer while the last layer mentioned is the top layer). Although the term SONOS is suggestive of an ONO layer, the term SONOS encompasses nonvolatile memory devices containing other types of charge trapping dielectrics as indicted by the foregoing examples.

Figure 5:
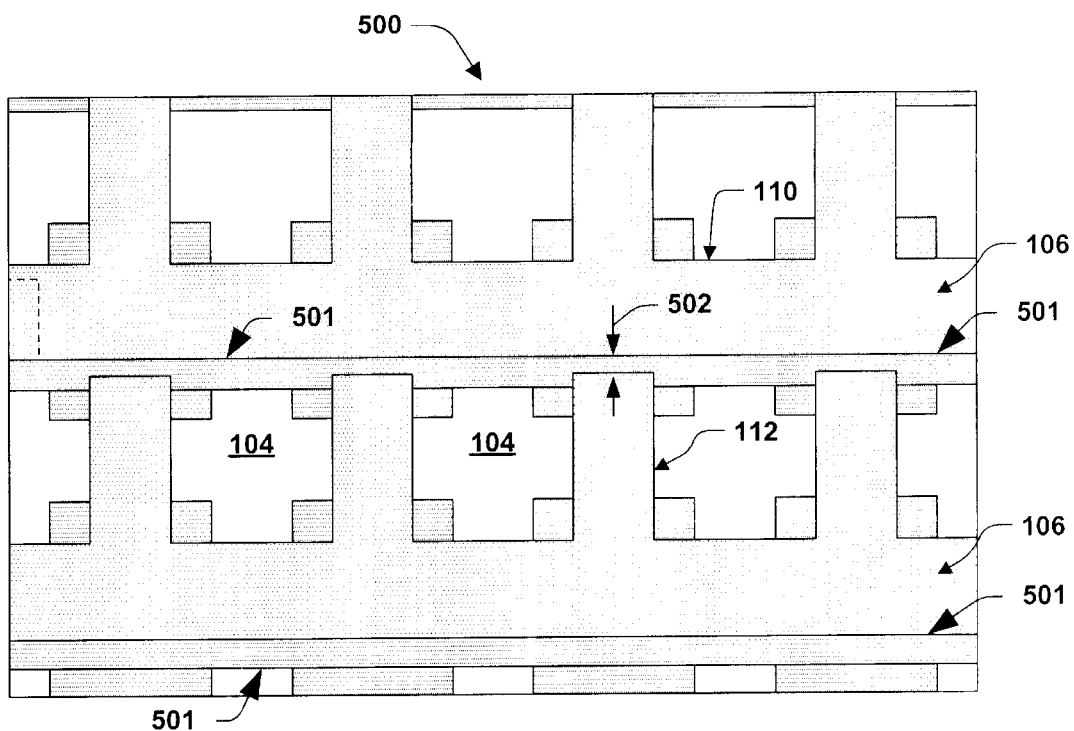
FIG. 5 a schematic illustration showing a memory device according to a further aspect of the present invention.

The forgoing process relies on lithography to separate the dead end branches of one word line from the main branch of an adjacent word line. An alternative approach is to use a spacer approach to achieve the minimum spacing between the dead end branches and the main word line. FIG. 5 illustrates a device 500 in which a spacer 501 is used to define the etch space 502 between the dead end branches 112 from the main branches 110 of adjacent word lines. By using a dielectric spacer 501 and not relying on lithography to separate the word lines, word lines can be placed closer together.

Figure 6:
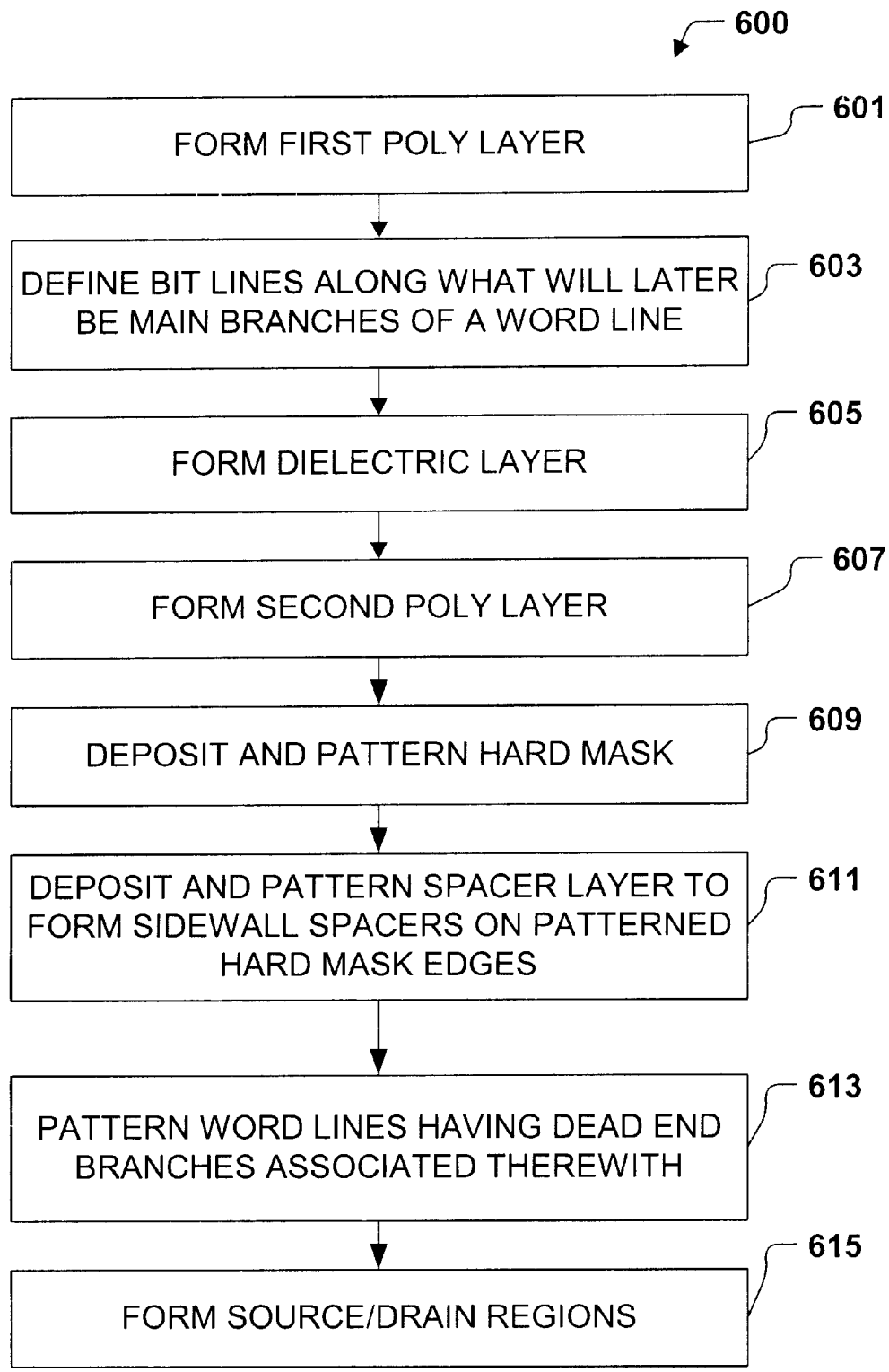
FIG. 6 is a flow chart of a process for forming a memory device according to a still further present invention.

The dielectric spacer can be provided by a process such as process 600 illustrated with a flow chart in FIG. 6. Process 600 includes act 601, forming a first polysilicon layer, and patterning the layer 603 to define bit lines along what will later be main branches or a word line. At 605 a dielectric layer is formed (e.g., an ONO layer), followed by the formation of a second polysilicon layer at 607 which will be employed to form word lines. At 609, a hard mask layer (e.g., a nitride layer) is deposited and patterned, followed by the formation of spacer layer deposition and etch at 611 to form sidewall spacers on edges of the patterned hard mask. The sidewall spacers will define the distance 502 between the dead end branch of one word line and a neighboring word line, and since it is a self-aligned type process, the distance 502 can be minimized. After the spacer formation at 611, a poly etch of the second polysilicon layer (using both the hard mask and the sidewall spacers associated therewith to protect the word lines) is carried out at 613 to form the word lines. Subsequent processing at 615 may then be carried out to form the source/drain regions.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary. Components described in functional terms have structure and involve acts, unless otherwise indicated, corresponding to any of the devices and methods known to those of ordinary skill in the art to perform those functions, even though not equivalent to any of the structures and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

What is claimed is:

1. A virtual ground array flash memory device, comprising:

a plurality of flash memory cells comprising cell gate stacks, the cell gate stacks individually comprising one of a floating gate and a charge trapping dielectric; and
combined source/drain regions;
wherein a plurality of the combined source/drain regions are shared by more than two of the flash memory cells.

2. The virtual ground array flash memory device of claim 1, wherein the plurality of the combined source/drain regions are shared by exactly four flash memory cells each.

3. The virtual ground array flash memory device of claim 1, wherein the plurality of the combined source/drain regions are formed in a semiconductor substrate and are electrically isolated from one another within the semiconductor.

4. A flash memory device, comprising:
flash memory cells comprising control gates; and
word lines connecting the control gates;
wherein the word lines have a principal direction and comprise a plurality of dead end branches extending off the principal direction.

5. The flash memory device of claim 4, wherein a portion of the flash memory cells lie along portions of the word lines extending along the principal direction of the word lines and another portion of the flash memory cells lie along the dead end branches.

6. The flash memory device of claim 4, wherein the dead end branches are approximately perpendicular to the principal directions of the word lines.

7. The flash memory device of claim 4, wherein the flash memory cells have a width generally equal to a word line width, and the dead end branches are no longer than about two word line widths.

8. The flash memory device of claim 7, wherein the word line width is about 0.25 micron or less.

9. The flash memory device of claim 8, wherein the word line width is about 0.10 micron or less.

10. A flash memory device, comprising:
a plurality of flash memory cells; and
source and drain regions forming an array having rows and columns;
wherein a first portion of the flash memory cells are read with source and drain regions sharing a row of the array and a second portion of the flash memory cells are read with source and drain regions sharing a column of the array.

11. The flash memory device of claim 10, wherein the flash memory device is a virtual ground array having combined source/drain regions.

12. The flash memory device of claim 11, wherein a portion of the combined source/drain regions lying along a column are electrically connected skipping every other source/drain region in the column.

13. A flash memory device, comprising:

unit cells; and flash memory cell stacks;

wherein there are at least two memory cell stacks for each unit cell, wherein the flash memory cell stacks are arranged in two overlapping arrays staggered with respect to one another, wherein a straight line between two flash memory cells closest to a given flash memory cell does not intersect the given flash memory cell.

14. A flash memory device, comprising:

flash memory cells; and combined source/drain regions for the flash memory cells;

wherein the source/drain regions are arranged in columns and there are two electrically isolated bit lines per column.

15. The flash memory device of claim 14, wherein the bit lines for a column each contact every other combined source/drain region in the column.

* * * * *